(12) United States Patent
Klarenbeek (10) Patent No.: US 7,804,603 B2
(45) Date of Patent: Sep. 28, 2010

(54) MEASUREMENT APPARATUS AND METHOD

(75) Inventor: Eduard Martinus Klarenbeek, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 763 days.

(21) Appl. No.: 11/541,793

(22) Filed: Oct. 3, 2006

(65) Prior Publication Data

US 2008/0079930 A1 Apr. 3, 2008

(51) Int. Cl.
*G01B 11/14* (2006.01)

(52) U.S. Cl. .................... 356/614; 355/42; 355/47; 355/53; 355/72; 356/121; 356/399; 356/511

(58) Field of Classification Search .............. 355/42, 355/47, 67, 53, 72; 356/121, 614, 399–401, 356/490–511
See application file for complete search history.

(56) References Cited

U.S. PATENT DOCUMENTS

| | | | |
|---|---|---|---|
| 5,229,872 A | 7/1993 | Mumola | 359/40 |
| 5,296,891 A | 3/1994 | Vogt et al. | 355/67 |
| 5,523,193 A | 6/1996 | Nelson | 430/311 |
| 6,133,986 A | 10/2000 | Johnson | |
| 7,170,584 B2 | 1/2007 | Derksen | |
| 7,193,204 B2 * | 3/2007 | Mitchell | 250/231.14 |
| 7,233,384 B2 * | 6/2007 | Venema et al. | 355/53 |
| 7,460,208 B2 * | 12/2008 | Bleeker et al. | 359/290 |
| 7,580,559 B2 | 8/2009 | Latypov et al. | |

| | | | |
|---|---|---|---|
| 2005/0275840 A1* | 12/2005 | Gui et al. | 356/614 |

FOREIGN PATENT DOCUMENTS

| | | |
|---|---|---|
| JP | 11-271650 A | 10/1999 |
| JP | 2002-367900 A | 12/2002 |
| JP | 2004-266198 A | 9/2004 |
| JP | 2004-304135 A | 10/2004 |
| JP | 2005-223328 A | 8/2005 |
| JP | 2006-19573 A | 1/2006 |
| JP | 2006-065118 A | 3/2006 |
| JP | 2006-148107 A | 6/2006 |
| WO | WO 98/33096 | 7/1998 |
| WO | WO 98/38597 A2 | 9/1998 |
| WO | WO 98/38597 A3 | 9/1998 |

OTHER PUBLICATIONS

Japanese Office Action for Patent Application No. 2007-249522 dated Jul. 27, 2010.

* cited by examiner

*Primary Examiner*—Gregory J Toatley, Jr.
*Assistant Examiner*—Iyabo S Alli
(74) *Attorney, Agent, or Firm*—Pillsbury Winthrop Shaw Pittman, LLP (57) ABSTRACT

A measurement apparatus disclosed that has a radiation source configured to provide a measurement beam of radiation such that an individually controllable element of an array of individually controllable elements capable of modulating a beam of radiation, is illuminated by the measurement beam and redirects the measurement beam, and a detector arranged to receive the redirected measurement beam and determine the position at which the redirected measurement beam is incident upon the detector, the position at which the redirected measurement beam is incident upon the detector being indicative of a characteristic of the individually controllable element.

32 Claims, 5 Drawing Sheets

MEASUREMENT APPARATUS AND METHOD

FIELD

The invention relates to a measurement apparatus and method. In particular, but not exclusively, the invention relates to a measurement apparatus and method for use in a lithographic apparatus and a device manufacturing method respectively.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device (e.g., a mask) may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). Instead of a mask, the patterning device may comprise a patterning array that comprises an array of individually controllable elements. An advantage of a system using a patterning array compared to a mask-based system is that the pattern can be changed more quickly and for less cost.

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

A lithographic apparatus typically comprises an illuminator configured to provide a conditioned illumination beam of radiation. In order to provide a shaped illumination beam, one or more masks may be provided within the illuminator in order to block off portions of the illumination beam, thus changing the pupil shape of the illumination beam. Alternatively or additionally, an array of individually controllable elements, such as a programmable mirror array, arranged to selectively reflect portions of the illumination beam may be provided in order to create a shaped illumination beam that can be controlled, and thus readily changed from one cross sectional pattern to another. However, the illumination beam typically operates at a relatively high intensity, such that, for example, the array of individually controllable elements may become heated. Such heating may, for example, affect the accuracy of the beam path along which the illumination beam is selectively reflected, thus causing the shaped illumination beam to deviate from the expected shape.

SUMMARY

According to an aspect of the invention, there is provided a measurement apparatus comprising:

a radiation source configured to provide a measurement beam of radiation such that an individually controllable element of an array of individually controllable elements capable of modulating a beam of radiation, is illuminated by the measurement beam and redirects the measurement beam; and a detector arranged to receive the redirected measurement beam and determine the position at which the redirected measurement beam is incident upon the detector, the position at which the redirected measurement beam is incident upon the detector being indicative of a characteristic of the individually controllable element.

According to a further aspect of the invention, there is provided a measurement method comprising:

illuminating, with a measurement beam of radiation, an individually controllable element of an array of individually controllable elements, the array being capable of modulating a beam of radiation, the illuminating being such that the individually controllable element redirects the measurement beam of radiation;

receiving the redirected measurement beam at a detector; and determining the position at which the redirected measurement beam is incident upon the detector, the position at which the redirected measurement beam is incident upon the detector being indicative of a characteristic of the individually controllable element.

According to an aspect of the invention, there is provided a lithographic apparatus, comprising:

an illumination system arranged to provide an illumination beam of radiation;

a measurement apparatus comprising:
   a radiation source configured to provide a measurement beam of radiation such that an individually controllable element of an array of individually controllable elements capable of modulating a beam of radiation, is illuminated by the measurement beam and redirects the measurement beam, and
   a detector arranged to receive the redirected measurement beam and determine the position at which the redirected measurement beam is incident upon the detector, the position at which the redirected measurement beam is incident upon the detector being indicative of a characteristic of the individually controllable element.

a support structure configured to hold a patterning device, the patterning device arranged to impart the illumination beam with a pattern in its cross-section; and a projection system arranged to project the patterned beam of radiation onto a target portion of a substrate.

According to an aspect of the invention, there is provided a device manufacturing method, comprising:

providing an illumination beam of radiation using an illumination system;

illuminating, with a measurement beam of radiation, an individually controllable element of an array of individually controllable elements, the array being capable of modulating a beam of radiation, the illuminating being such that the individually controllable element redirects the measurement beam of radiation;

receiving the redirected measurement beam at a detector;

determining the position at which the redirected measurement beam is incident upon the detector, the position at which the redirected measurement beam is incident upon the detector being indicative of a characteristic of the individually controllable element;

using a patterning device to impart the illumination beam with a pattern in its cross-section; and projecting the patterned beam of radiation onto a target portion of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
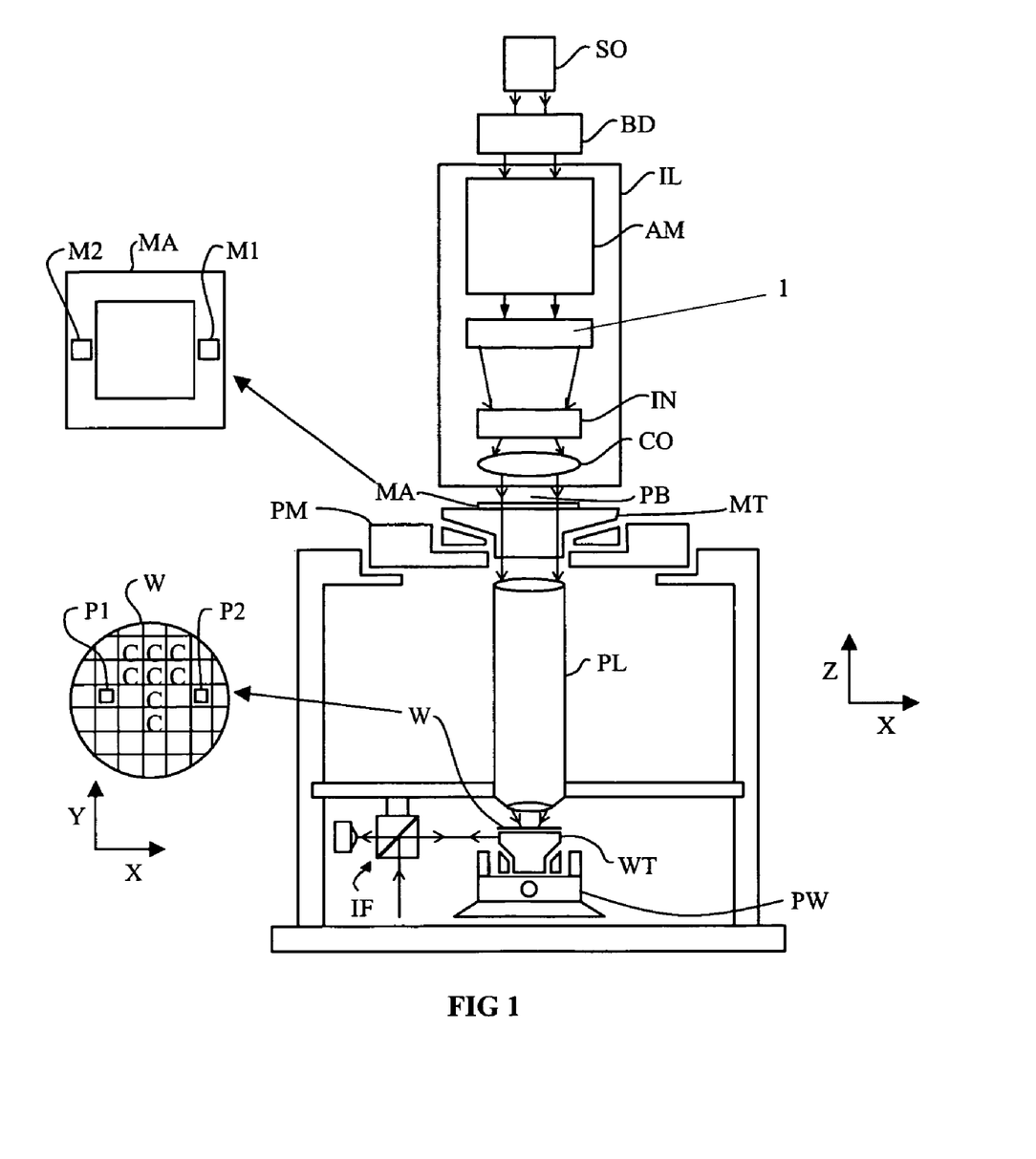
FIG. 1 depicts a lithographic apparatus according to an embodiment of the invention.

FIG. 1 schematically depicts a lithographic apparatus incorporating a measurement apparatus according to a particular embodiment of the invention. The lithographic apparatus comprises:

an illumination system (illuminator) IL configured to provide a beam PB of radiation (e.g. UV radiation);

a support structure (e.g. a mask table) MT configured to hold a patterning device (e.g. a mask) MA and connected to a first positioner PM configured to accurately position the patterning device with respect to item PL;

a substrate table (e.g. a wafer table) WT configured to hold a substrate (e.g. a resist-coated wafer) W and connected to a second positioner PW configured to accurately position the substrate with respect to item PL; and a projection system (e.g. a refractive projection lens) PL configured to image a pattern imparted to the beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The support structure MT holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The illumination system may also encompass various types of optical components, including refractive, reflective, and catadioptric optical components for directing, shaping, or controlling the beam of radiation, and such components may also be referred to below, collectively or singularly, as a "lens".

In accordance with an embodiment of the invention, the illuminator IL further comprises a programmable mirror array 1 arranged to modulate the beam PB, as will be described in more detail below. FIG. 1 schematically illustrates the illuminator IL as a linear structure with the beam from the source SO entering at one end and the beam PB exiting at the other end. However, it will be appreciated that this need not necessarily be the case. Indeed, in an embodiment of the invention incorporating a reflective programmable mirror array 1 within the illuminator IL, the beam PB may exit the illuminator along a beam path transverse to the beam path of the beam from the source SO.

The beam PB is incident on the patterning device MA, which is held on the support structure MT. Having traversed the patterning device MA, the beam PB passes through the projection system PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

As noted above, there may be provided a patterning device MA (e.g. an array of individually controllable elements) that modulates the beam PB to create a pattern on the target portion of the substrate. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of patterning devices include, e.g., masks, programmable mirror arrays, laser diode arrays, light emitting diode arrays, grating light valves, and LCD arrays. Patterning devices whose pattern is programmable with the aid of electronics (e.g., a computer), such as patterning devices comprising a plurality of programmable elements that can each modulate the intensity of a portion of the radiation beam, (e.g., all the devices mentioned in the previous sentence except for the mask), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, such a patterning device comprises at least 10 programmable elements, e.g. at least 100, at least 1000, at least 10000, at least 100000, at least 1000000, or at least 10000000 programmable elements.

Embodiments of several of these devices are discussed in some more detail below:

A programmable mirror array. This may comprise a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate; in this manner, the beam becomes patterned according to the addressing pattern of the matrix-addressable surface. It will be appreciated that, as an alternative, the filter may filter out the diffracted radiation, leaving the undiffracted radiation to reach the substrate. An array of diffractive optical MEMS devices may also be used in a corresponding manner. A diffractive optical MEMS device is comprised of a plurality of reflective ribbons that may be deformed relative to one another to form a grating that reflects incident radiation as diffracted radiation. A further alternative embodiment of a programmable mirror array employs a matrix arrangement of tiny mirrors, each of which may be individually tilted about an axis by applying a suitable localized electric field, or by employing piezoelectric actuator. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronics. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually controllable elements, each controlled independently of each other. In such an arrangement, some or all of the arrays of individually controllable elements may have a common illumination system (or part of an illumination system), a common support structure for the arrays of individually controllable elements, and/or a common projection system (or part of the projection system).

In accordance with an embodiment of the invention, the illuminator IL further comprises an array of individually controllable elements 1, such as a programmable mirror array, arranged to modulate the illumination beam. The array of individually controllable elements selectively direct portions of the illumination beam in order to provide a shaped illumination that can be controlled, and thus changed from one cross sectional pattern to another. That is, the array of individually controllable elements is arranged to modulate the pupil shape of the illumination beam.

In an embodiment, the array of individually controllable elements 1 comprises a programmable mirror array of individually controllable mirror elements within the illuminator. Such a programmable mirror array may be similar to a programmable mirror array used as a patterning device to impart the pattern to the beam to be projected onto a target portion of the substrate as described above for the lithographic apparatus of FIG. 1. The skilled person will appreciate that alternative patterning devices that are known for use within a lithographic apparatus may be suitable for use within the illuminator. However, the number of individually controllable elements within the illuminator is typically fewer. For instance, the array of individually controllable elements within the illuminator may comprise approximately 60×60 individually controllable elements. Furthermore, each individually controllable element within the illuminator is typically arranged such that it can be tilted in two orthogonal directions, whereas within the patterning device each individually controllable element typically only tilts in a single direction.

In a programmable mirror array embodiment, control of the tilt angle for each mirror element is achieved by control of charged plates positioned behind each mirror element. Each mirror element is electrostatically attracted to or repelled by the charged plates. Each mirror element is typically of the order of 0.8 mm×0.8 mm, and may be tilted by approximately plus or minus 5° from its center position. The required accuracy for the tilt of an individual mirror element is approximately $\frac{1}{1000}$ of the full-scale movement, (or 0.01° for full-scale movement of 10°). Each time the position of a mirror is altered the settling time is approximately 10 ms.

Being able to modulate the illumination beam that is incident upon the array of individually controllable elements may be desirable for an embodiment of a lithographic apparatus in which it is desirable to be able to rapidly switch between different cross sections of an illumination beam. Additionally or alternatively, such a controllable array may be advantageous in that it is relatively cheap and flexible in providing any desired illumination setting. For instance, it may be necessary to switch between different lithographic patterning devices in order to project patterns onto different sections of the substrate. Each patterning device may itself require an illumination beam with a different illumination mode (i.e. angular distribution). As noted above, a lithographic apparatus may provide such varying modes for the illumination beam by providing a mask in the illuminator that can be changed between exposures of the substrate. However, it can be time consuming to change the illuminator mask, for instance when the patterning device is switched. Therefore, the ability to rapidly and controllably change the cross section of the illumination beam by controlling an array of individually controllable elements may be advantageous.

However, the unmodulated illumination beam incident upon the array of individually controllable elements is typically at a relatively high intensity, such that the array of individually controllable elements can become heated. Such heating can affect the accuracy with which the illumination beam is selectively directed, thus causing the shaped illumination beam to deviate from its expected shape.

For a patterning device comprising a programmable mirror array, the intensity of the beam is reduced due to the number of optical elements through which the beam has passed before reaching the patterning device. This means that the individual mirrors are not heated as much, and thus the accuracy of the mirror array is higher. Consequently, for the patterning device, it is typically not necessary to measure the tilt angle of each mirror element during a lithographic exposure operation. Acceptable levels of accuracy may be achievable using measurement systems positioned on the substrate table in between lithographic operations.

To achieve an acceptable level of accuracy for an array of individually controllable elements within the illuminator, it may be necessary however to measure the tilt angle of individual elements during a lithographic operation. This is due to changes in the material properties of individual elements as a result of the thermal load causing the tilt angle of elements to tilt unpredictably. The substrate upon which the array of individually controllable elements is mounted may also be heated causing the elements to tilt unpredictably. In addition or alternatively to the effects of heating of the elements and the substrate, other factors may cause the tilt of individual elements to change over time, causing a reduction in the tilt accuracy of elements. For instance, mechanical deformation of the substrate caused by reaction forces due to element actuation may cause the tilt to change.

In an embodiment, the array of individually controllable elements comprises mirror elements mounted upon control electronics arranged to control the tilt of each mirror element. The available volume behind each mirror element is limited, and thus it is desirable not to locate one or more tilt sensors behind the mirror elements. Furthermore, the temperature in the direct area around the mirror elements is subject to significant variation, which would be liable to affect the one or more tilt sensors. Further, it is not desirable to mount one or more tilt sensors on the mirror side of each element, as this would reduce the available reflective area.

In accordance with an embodiment of the invention, there is provided an optical measurement method and apparatus capable of determining the tilt angle of individually controllable elements of the array of individually controllable elements in the illuminator in real time during lithographic operations, without interfering with the lithographic operation. Such an optical approach is advantageous in that it can be placed at a relatively large distance from the array of individually controllable elements and thus is not itself adversely affected by the temperature instability of the array. Additionally, as the optical system does not contact the array, it does not directly affect the tilt of the elements.

As the optical system can be used in real time, the measurement of the tilt of an individual element can be fed back to the lithographic apparatus and used to alter the control signal provided to the programmable array within the illuminator in order to correct the tilt of individual elements which are found to have deviated from their expected tilt angle.

Figure 2:
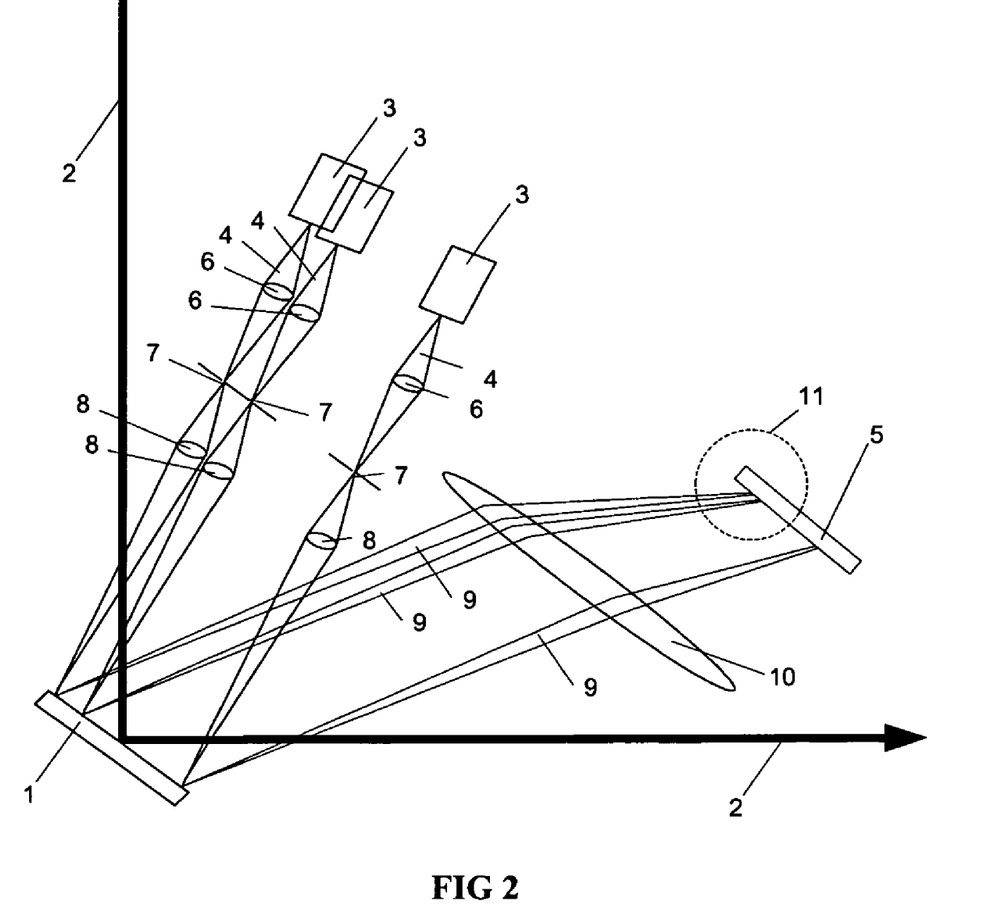
FIG. 2 depicts a measurement apparatus for an illuminator, which comprises part of the lithographic apparatus of FIG. 1.

Referring to FIG. 2, there is schematically illustrated a measurement system that is part of the illuminator IL of the lithographic apparatus of FIG. 1 in accordance with an embodiment of the invention. Programmable mirror array 1 is depicted reflecting the beam from the source SO towards the patterning device MA, schematically represented by line 2. The other components of the illuminator IL are not shown in FIG. 2 for reasons of clarity.

In order to measure the tilt of individual mirror elements, a plurality of separate radiation sources 3 are provided, each of which provides a separate measurement beam of radiation 4. The radiation sources 3 may comprise LEDs or lasers, depending upon the sensitivity or the saturation level of a detector 5 (described below). Each measurement beam is focused by a respective lens 6 (or a suitable micro array of lenses) such that the measurement beams 4 pass through respective apertures 7. In an embodiment, a single radiation source 4 could provide each of the measurement beams 4.

The emergent beams from apertures 7 are then focused by lenses 8 such that each measurement beam 4 is incident upon a respective mirror element within the programmable mirror array 1. That is, each mirror element is illuminated by a spot from a separate measurement beam 4. The alignment of each radiation source 3 and/or radiation beam 4 with the respective mirror element of the programmable mirror array 1 is not critical, so long as the spot size at each mirror element is small compared to the reflective area of that mirror element. Each mirror element reflects the measurement beam 4 as a reflected measurement beam 9. The angle of incidence of the measurement beams 4 upon the programmable mirror array 1 is chosen such that the reflected measurement beams 9 are reflected away from radiation sources 3 towards a detector 5. The reflected measurement beams 9 are focused towards the detector 5 by a lens 10. In an embodiment, multiple detectors 5 may be provided.

The detector 5 comprises an image sensor. The image sensor may comprise a detector array such as a charge-coupled device (CCD) comprising an array of individual radiation detectors or pixels. The position at which each beam is incident upon the detector array 5 is measured. Relative movement of a reflected measurement beam 9 is detected by the detector array 5. Changes in the tilt angle of a mirror element cause movement of the point at which the reflected measurement beam 9 is incident upon the detector array 5. Thus, measurement of the position of the measurement beam 9 upon the detector array provides a determination of the tilt angle of the mirror element.

The measurement system is separate from optical elements within the illuminator configured to generate and focus the illumination beam. Indeed, it can be seen from FIG. 2 that the measurement beams 4 and the reflected measurement beams 9 travel along beam paths separate from the path 2 of the beam to be patterned by the patterning device MA. Furthermore, in order to prevent interference with that beam, the measurement apparatus makes use of one or more radiation sources 3 which emit radiation at a wavelength different to that of the beam, for instance within the green to red portion of the visible spectrum.

Figure 3:
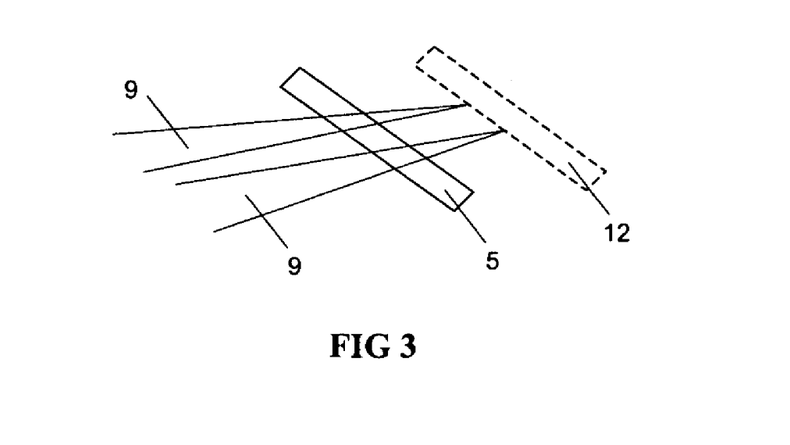
FIG. 3 depicts an enlarged portion of the measurement apparatus of FIG. 2.

Referring to FIG. 3, an enlargement of part of FIG. 2, indicated by the dotted circle 11, is schematically illustrated. FIG. 3 shows two reflected measurement beams 9 and the position of the detector array 5. It can be seen that the detector array 5 is outside of the focal plane 12 of the reflected measurement beams. This is in order to detect movement of the reflected measurement beams 9 across the detector. If the detector array 5 were to be in the focal plane, an image of the mirror array would be received, and movement of the measurement beams would not be detected. The detector array 5 may be positioned either in front of the focal plane 12 (as illustrated in FIG. 3) or behind the focal plane 12. Furthermore, by positioning the detector array 5 out of the focal plane 12, each reflected measurement beam 9 illuminates the detector array 5 with a broad spot, rather than a point. It is desirable for each reflected measurement beam 9 to illuminate more than one cell of the detector array 5 in order for movement of the position of the reflected measurement beam 9 to be detected with a greater level of accuracy (as will be described in greater detail below with reference to FIGS. 4A to 4D).

Using a commercially available two dimensional detector array, it is possible to measure the tilt of an individual mirror element in two tilt directions to an accuracy of $\frac{1}{1000}$ of the full-scale tilt of each mirror element, at a measurement rate of up to 5 kHz. This allows for high-speed tilt error correction. As the update rate of the control electronics that control each mirror element is approximately 200-400 Hz for a commercially available mirror array, it is clear that the measurement apparatus is sufficiently fast to respond before a next control signal is sent to the mirror element. The tilt angle of a single mirror element can be measured. Alternatively or additionally, the tilt angles of a group of mirror elements, or the whole of the mirror array, can be measured.

For each mirror element, the position at which the reflected measurement beam 9 intersects the detector array 5 when the mirror element is at a default position (for instance no tilt) is determined. This can be established by calibrating the optical system of FIG. 2 using an independent measurement system, for instance one positioned on the substrate table, when the lithographic apparatus is not projecting onto a substrate. The independent measurement system is used to steer each mirror element into a no tilt position, and then the position of the reflected measurement beam within the detector array is measured. The tilt angle is then varied and the corresponding variation in spot position at the detector array recorded. After the system has been calibrated in this manner then variation in the tilt of each mirror element can be measured while the lithographic apparatus is projecting onto a substrate, and if necessary used to alter the control signal provided to the mirror element to correct the tilt angle. This calibration process may be repeated periodically in order to ensure the accuracy of the measurement system over time.

The detector array 5 may comprise a two-dimensional image system, such as a CCD. A commercially available image system that may be suitable offers resolution of 1024× 1024 pixels, each pixel approximately 12 μm×12 μm. It can be seen that the number of available pixels is much greater than the number of reflected measurement beams projected onto the detector array.

Figure 4A:
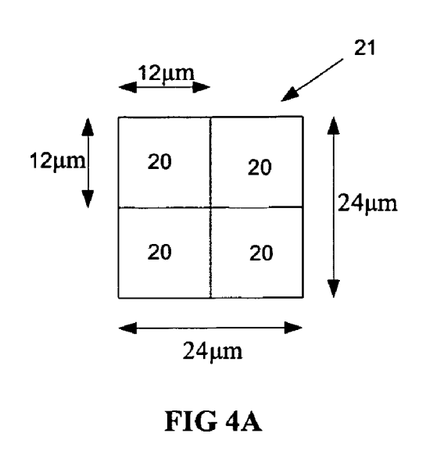
FIGS. 4A to 4D depict portions of a detector array, which is part of the measurement apparatus of FIG. 2.

In order to reduce the number of outputs from the CCD, in accordance with an embodiment of the invention, groups of pixels are combined such that the combined signal from the group is provided as a single output. FIG. 4A schematically illustrates a group of four pixels 20 combined to form a single detector group 21. Each pixel 20 measures 12 μm×12 μm, such that the detector group 21 measures 24 μm×24 μm. Combining groups of pixels in this way has an advantage of speeding up the data output from the CCD.

Figure 4B:
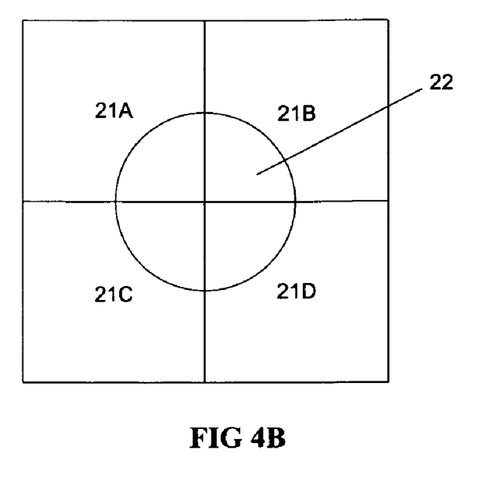

As noted above, it is desirable that the detector array 5 is positioned so that the reflected measurement beam 9 is larger than a single pixel 20 (or group of pixels 21 if they are combined as described above). This increases the measurement accuracy as the projected spot moves across the detector array 5. The movement of a spot is detected as the proportion of radiation detected by each group 21 varies. FIG. 4B depicts four groups of pixels 21A-21B illuminated by a spot 22 from a single reflected measurement beam 9. It can be seen that spot 22 is incident equally upon all four groups 21A-21D. Consequently, the proportion of the incident radiation detected by each group of pixels will be the same. As long as the proportion of radiation detected by each group of pixels is known for the no tilt position, any deviation from this known detection pattern can be detected and the corresponding change in tilt angle determined.

Figure 4C:
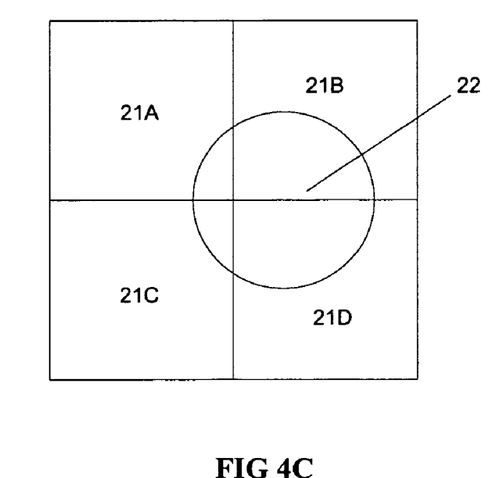
Figure 4D:
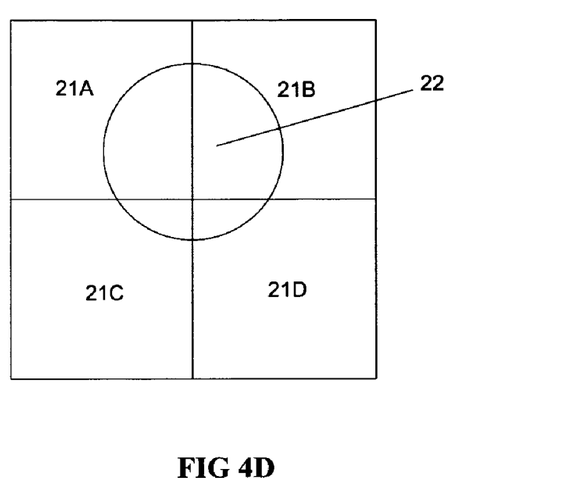

FIG. 4C illustrates a situation in which the spot 22 has moved in a first direction, due to the mirror element tilting about a first axis. It can be seen that the proportion of the incident radiation detected by pixel groups 21B and 21D will have increased, whereas the proportion of the incident radiation detected by pixel groups 21A and 21C will have decreased. From the change in the proportion of radiation detected by each pixel group, given knowledge of the intensity profile of the reflected measurement beams, the distance by which the incident spot has moved can be determined, and consequently the change in tilt angle for the associated mirror element determined. Similarly, FIG. 4D illustrates the situation in which the mirror element tilt angle has changed about a different axis. It will be appreciated that if the tilt angle has changed about both axes then this will also be detectable.

It will be appreciated that the size of the beam spot may be varied, for instance by changing the position of the detector array 5 relative to the focal plane 12 of the reflected measurement beams or by adjusting any one or more of lenses 6, 8 and 10. Consequently, the number of pixels or groups of pixels illuminated by each beam may change. In the example embodiment of FIGS. 4B to 4D, sixteen pixels 20 (in four groups 21 of four pixels) are reserved for detecting the position of a single reflected measurement beam 9. The spot size is chosen so that it will not stray outside of the area of the CCD reserved for detecting a single reflected measurement beam when the associated mirror element is at full tilt. This is to ensure that none of the radiation from a single reflected calibration beam is incident upon areas of the detector array reserved for detecting other reflected measurement beams.

Figure 5:
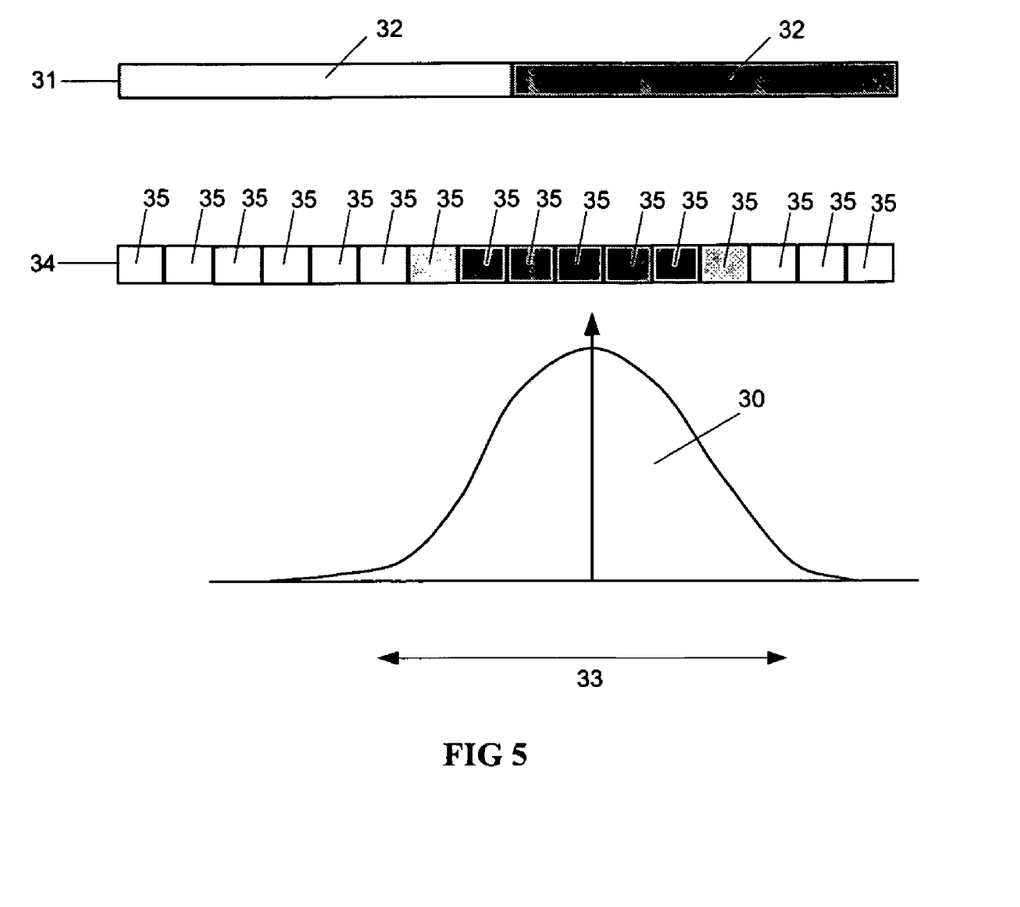
FIG. 5 depicts a representation of the power intensity of a reflected measurement beam of radiation, and the detection pattern of the reflected measurement beam at the detector array.

The intensity profile across the beam is chosen so as to optimize the detection of a shift in the position of the spot. As the tilt of the mirrors is related to the displacement of the spot on the detector array, it is desirable to have a beam intensity profile that continuously decreases in intensity from the center of the beam, for instance a Gaussian-like intensity profile, in order to determine the mirror tilt. FIG. 5 depicts a suitable intensity profile 30 for a reflected measurement beam 9 as detected at the detector array 5. It can be seen that the intensity profile 30 rapidly reduces to zero at the extremes of the profile, which as noted above is desirable to prevent interference between reflected measurement beams of radiation across different portions of the detector array. The beam intensity profile is determined by properties of one or more of the lenses 6, 8, 10 and their separation.

As noted above, in order to increase the rate at which data can be output from the detector array 5, it is desirable to combine the outputs of groups of pixels 21. The minimum number of pixels 20 or groups of pixels 21 needed in order to determine the center position of a spot moving along a single axis is two. Referring to FIG. 5, top line 31 illustrates two groups of pixels 32 used to detect a spot projected by a beam having the radiation intensity profile 30. It can readily be seen that when the spot moves along axis 33, the proportion of radiation (shown by the shading—the darker, the higher the proportion) detected by pixel groups 32 will vary. The signal ratio of the outputs from pixel groups 32 gives a measure of the position of the spot along axis 33. Alternatively, a larger number of pixel groups may be illuminated by a single spot (either by increasing the size of the spot, or reducing the number of pixels per group). Line 34 depicts 16 groups of pixels 35, which are arranged to detect the spot projected by the beam having the radiation intensity profile 30, the proportion of radiation detected by each pixel group 35 shown by its shading—the darker, the higher the proportion.

Figure 6:
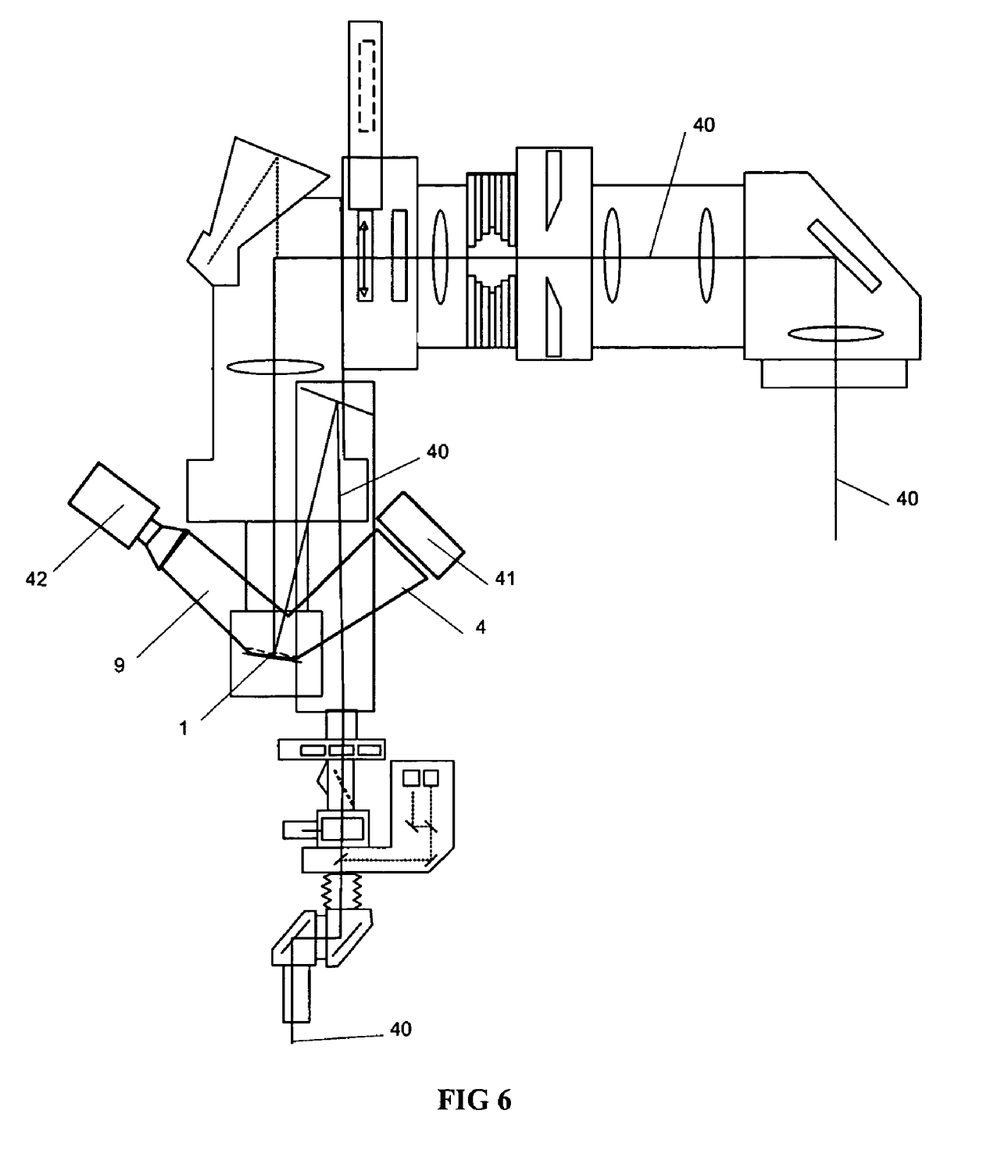
FIG. 6 depicts a schematic representation of an illumination system incorporating an embodiment of the invention.

Referring to FIG. 6, an illuminator for a lithographic apparatus incorporating a measurement system in accordance with an embodiment of the invention is schematically illustrated. The illuminator is arranged to pass a beam along beam path 40 from the beam source to the patterning device. Beam path 40 intersects the programmable mirror array 1, which selectively reflects portions of the beam. The measurement radiation sources 3 are collectively depicted as a single source 41. Detector array 5 is schematically illustrated as a camera 42, with the radiation reflected between the source 41 and the camera 42 schematically indicated by beams 4 and 9. FIG. 6 shows that the measurement beam 4 and the reflected measurement beam 9 do not interfere with the beam path 40 of the beam. Other portions of the illuminator of FIG. 6 are conventional, and thus will not be described in detail here.

It will be appreciated that the above described measurement system for an array of individually controllable elements within an illuminator may be applied in both reflective and transmissive lithographic apparatuses.

It will be appreciated that while one or more embodiments of the invention have been predominantly described as being arranged to measure the tilt angle of mirror elements forming a programmable mirror array within an illuminator, it is not limited to this. Indeed, a tilt angle measurement apparatus in accordance with an embodiment of the invention may be applied to any array of individually controllable elements, for instance a micro mirror array forming the patterning device for a lithographic apparatus or grating light valves forming the array of individually controllable elements.

As used herein, the term redirected or redirecting broadly includes, respectively, reflected or reflecting, refracted or refracting, diffracted or diffracting, etc.

Although specific reference may be made in this text to the use of lithographic apparatus in the manufacture of ICs, it should be understood that the measurement apparatus and lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more support structures). In such "multiple stage" machines the additional tables (and/or support structures) may be used in parallel, or preparatory steps may be carried out on one or more tables (and/or support structures) while one or more other tables (and/or support structures) are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

While specific embodiments of the invention have been described above, it will be appreciated that the invention may be practiced otherwise than as described. The description is not intended to limit the invention.

The invention claimed is:

1. A measurement apparatus comprising:
a radiation source configured to provide a measurement beam of radiation such that an individually controllable element of an array of individually controllable elements capable of modulating a beam of radiation, is illuminated by the measurement beam and redirects the measurement beam; and
a detector arranged to receive the redirected measurement beam and determine the position at which the redirected measurement beam is incident upon the detector, the position at which the redirected measurement beam is incident upon the detector being indicative of a characteristic of the individually controllable element.

2. The measurement apparatus according to claim 1, wherein the detector is positioned out of a focal plane of the redirected measurement beam.

3. The measurement apparatus according to claim 1, wherein the detector comprises an image sensor.

4. The measurement apparatus according to claim 3, wherein the image sensor comprises an array of pixel elements each arranged to provide an output signal indicative of received radiation.

5. The measurement apparatus according to claim 4, wherein the outputs of groups of pixel elements are grouped, such that the total number of output signals is reduced.

6. The measurement apparatus according to claim 5, wherein the redirected measurement beam illuminates at least two pixel elements or groups of pixel elements.

7. The measurement apparatus according to claim 6, wherein the detector is arranged to measure a proportion of radiation received by each pixel element or group of pixel elements from the redirected measurement beam in order to determine the position at which the redirected measurement beam is incident upon the detector.

8. The measurement apparatus according to claim 7, wherein the array of individually controllable elements comprises a programmable mirror array comprising a plurality of mirror elements each arranged to tilt in order to alter the direction in which they reflect the beam of radiation and the measurement beam.

9. The measurement apparatus according to claim 8, wherein the detector is further arranged to determine a tilt angle of a mirror element from the position at which the redirected measurement beam is incident upon the detector, the tilt angle comprising the characteristic of the individually controllable element.

10. The measurement apparatus according to claim 9, further comprising a separate measurement system arranged to receive the beam of radiation and determine the tilt angle of the mirror element in order to calibrate the determination of the tilt angle of a mirror element by the detector.

11. The measurement apparatus according to claim 9, wherein the measurement apparatus is further arranged to use the determined tilt angle to alter a control signal provided to the mirror element in order to correct the tilt angle.

12. The measurement apparatus according to claim 1, comprising a plurality of radiation sources configured to provide a plurality of measurement beams of radiation and arranged such that a plurality of individually controllable elements are illuminated with separate measurement beams and redirect a plurality of respective redirected measurement beams, the detector being arranged to receive the redirected measurement beams and determine the position at which each redirected measurement beam is incident upon the detector.

13. The measurement apparatus according to claim 1, wherein the measurement beam and the redirected measurement beam travel along beam paths that are not coincident with the beam path of the beam of radiation.

14. A lithographic apparatus, comprising:
an illumination system arranged to provide an illumination beam of radiation;
a measurement apparatus comprising:
a radiation source configured to provide a measurement beam of radiation such that an individually controllable element of an array of individually controllable elements capable of modulating a beam of radiation, is illuminated by the measurement beam and redirects the measurement beam, and
a detector arranged to receive the redirected measurement beam and determine the position at which the redirected measurement beam is incident upon the detector, the position at which the redirected measurement beam is incident upon the detector being indicative of a characteristic of the individually controllable element;
a support structure configured to hold a patterning device, the patterning device arranged to impart the illumination beam with a pattern in its cross-section; and
a projection system arranged to project the patterned beam of radiation onto a target portion of a substrate.

15. The lithographic apparatus according to claim 14, wherein the array of individually controllable elements is arranged to modulate a cross-section of the illumination beam within the illumination system, the beam of radiation comprising the illumination beam.

16. The lithographic apparatus according to claim 14, wherein the patterning device comprises the array of individually controllable elements, the beam of radiation comprising the illumination beam.

17. A measurement method comprising:
illuminating, with a measurement beam of radiation, an individually controllable element of an array of individually controllable elements, the array being capable of modulating a beam of radiation, the illuminating being such that the individually controllable element redirects the measurement beam of radiation;
receiving the redirected measurement beam at a detector; and
determining the position at which the redirected measurement beam is incident upon the detector, the position at which the redirected measurement beam is incident upon the detector being indicative of a characteristic of the individually controllable element.

18. The measurement method according to claim 17, wherein the detector is positioned out of a focal plane of the redirected measurement beam.

19. The measurement method according to claim 17, wherein the detector comprises an image sensor.

20. The measurement method according to claim 19, wherein the image sensor comprises an array of pixel elements each arranged to provide an output signal indicative of received radiation.

21. The measurement method according to claim 20, further comprising combining the outputs of groups of pixel elements, such that the total number of output signals is reduced.

22. The measurement method according to claim 21, wherein the redirected measurement beam illuminates at least two pixel elements or groups of pixel elements.

23. The measurement method according to claim 22, wherein determining the position at which a redirected measurement beam is incident upon the detector comprises measuring a proportion of radiation received by each pixel element or group of pixel elements from the redirected measurement beam.

24. The measurement method according to claim 23, wherein the array of individually controllable elements comprises a programmable mirror array comprising a plurality of mirror elements each arranged to tilt in order to alter the direction in which they reflect the beam of radiation and the measurement beam.

25. The measurement method according to claim 24, further comprising determining a tilt angle of a mirror element from the position at which a redirected measurement beam is incident upon the detector, the tilt angle comprising the characteristic of the individually controllable element.

26. The measurement method according to claim 25, further comprising calibrating the determination of the tilt angle of a mirror element by the detector using a separate measurement system arranged to receive the beam of radiation and determine the tilt angle of the mirror element.

27. The measurement method according to claim 25, further comprising using the determined tilt angle to alter a control signal provided to the mirror element in order to correct the tilt angle.

28. The measurement method according to claim 17, further comprising illuminating a plurality of individually controllable elements with separate measurement beams and determining the position at which each of a plurality of redirected measurement beams are incident upon the detector, each redirected measurement beam being redirected by a respective individually controllable element.

29. The measurement method according to claim 17, wherein the measurement beam and the redirected measurement beam travel along beam paths that are not coincident with the beam path of the beam of radiation.

30. A device manufacturing method, comprising:
providing an illumination beam of radiation using an illumination system;
illuminating, with a measurement beam of radiation, an individually controllable element of an array of individually controllable elements, the array being capable of modulating a beam of radiation, the illuminating being such that the individually controllable element redirects the measurement beam of radiation;
receiving the redirected measurement beam at a detector;
determining the position at which the redirected measurement beam is incident upon the detector, the position at which the redirected measurement beam is incident upon the detector being indicative of a characteristic of the individually controllable element;
using a patterning device to impart the illumination beam with a pattern in its cross-section; and
projecting the patterned beam of radiation onto a target portion of a substrate.

31. The device manufacturing method according to claim 30, wherein the array of individually controllable elements is arranged to modulate a cross-section of the illumination beam of radiation within the illumination system, the beam of radiation comprising the illumination beam.

32. The device manufacturing method according to claim 30, wherein the patterning device comprises the array of individually controllable elements, the beam of radiation comprising the illumination beam.

* * * * *